(12) United States Patent
Anthony (10) Patent No.: US 6,972,707 B1
(45) Date of Patent: Dec. 6, 2005

(54) SUB-RANGING PIPELINED CHARGE-DOMAIN ANALOG-TO-DIGITAL CONVERTER WITH IMPROVED RESOLUTION AND REDUCED POWER CONSUMPTION

(75) Inventor: Michael P. Anthony, Andover, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/889,282

(22) Filed: Jul. 12, 2004

(51) Int. Cl.$^7$ .............................................. H03M 1/12
(52) U.S. Cl. ..................................... 341/172; 341/162
(58) Field of Search ............................... 341/161, 162, 341/172

(56) References Cited

U.S. PATENT DOCUMENTS

| | | |
|---|---|---|
| 3,969,634 A | 7/1976 | Su et al. |
| 4,035,667 A | 7/1977 | Heller |
| 4,104,543 A | 8/1978 | Maeding |
| 4,206,446 A * | 6/1980 | Rockett, Jr. ................. 341/172 |
| 4,210,825 A | 7/1980 | Crochiere et al. |
| 4,239,983 A | 12/1980 | Edwards et al. |
| 4,246,496 A | 1/1981 | Heller |
| 4,489,309 A | 12/1984 | Schlig |
| 4,573,177 A | 2/1986 | Petrosky |
| 4,639,678 A | 1/1987 | Schlig et al. |
| 4,649,554 A | 3/1987 | Boudewijns et al. |
| 4,686,648 A | 8/1987 | Fossum |
| 5,030,953 A * | 7/1991 | Chiang ....................... 341/172 |
| 5,327,138 A * | 7/1994 | Linnenbrink et al. ....... 341/172 |
| 5,579,007 A | 11/1996 | Paul |
| 5,736,757 A | 4/1998 | Paul |

OTHER PUBLICATIONS

Fossum, Eric R., et al., "A Linear and Compact Charge-Coupled Charge Packet Differencer/Replicator", IEEE Transactions on Electron Devices, Dec. 1984, vol. ED-31, No. 12, 6 pages.
Fossum, Eric R., "Wire Transfer of Charge Packets for On-Chip CCD Signal Processing", SPIE, vol. 1242, Jul. 1990, pp. 179-188.
Colbeth, Richard E., et al., "A 1-GHz Charge-Packet Replicator/Subtractor Circuit for GaAs CCD Signal Processing", IEEE Journal of Solid-State Circuits, vol. 25, No. 4, Aug. 1990, pp. 1018-1019.
Fossum, Eric R., "Wire Transfer of Charge Packets Using a CCD-BBD Structure for Charge-Domain Signal Processing", IEEE Transactions on Electron Devices, vol. 38, No. 2, Feb. 1991, pp. 291-298.
Paul, Susanne A., et al., "A Nyquist-Rate Pipelined Oversampling A/D Converter", IEEE Journal of Solid State Circuits, vol. 34, No. 12, Dec. 1999, pp. 1777-1787.
Sheppard, Scott T., "Charge Coupled Devices", website http://www.ecn.purdue.edu/WBG/Device_Research/CCDs/Index.html, Oct. 26, 2001.

* cited by examiner

Primary Examiner—Howard L. Williams
(74) Attorney, Agent, or Firm—Daly, Crowley, Mofford & Durkee, LLP (57) ABSTRACT

A pipelined analog-to-digital converter in which signal value samples are represented differentially by pairs of charges and which uses charge-coupled-devices (CCDs) for delay and arithmetic operations on the charges is presented. In the pipeline, each successive stage resolves an equal or smaller charge difference. After a certain number of pipeline stages, the common-mode component of the signal-charge pair is reduced. The pipeline stages following this common-mode-charge reduction stage have a reduced charge capacity and size, allowing more sensitive charge comparison. The result is improved A/D converter resolution and reduced power consumption.

36 Claims, 6 Drawing Sheets

SUB-RANGING PIPELINED CHARGE-DOMAIN ANALOG-TO-DIGITAL CONVERTER WITH IMPROVED RESOLUTION AND REDUCED POWER CONSUMPTION

STATEMENTS REGARDING FEDERALLY SPONSORED RESEARCH

This invention was made with government support under Contract No. F19628-00-C-0002 awarded by the Air Force. The government has certain rights in the invention.

CROSS REFERENCE TO RELATED APPLICATIONS

Not Applicable.

FIELD OF THE INVENTION

The present invention relates generally to analog-to-digital converters and more specifically to pipelined analog-to-digital converters employing charge-coupled devices (CCDs).

BACKGROUND OF THE INVENTION

Pipelined charge-domain analog-to-digital converters (ADCs) are known. In these ADCs, a sampled analog signal is represented as a sequence of charges or of charge-pair differences. The signal charges are stored, transported and processed in one or more CCD shift registers. In addition to charge storage and shifting, these charge-domain ADCs employ the operations of charge splitting, charge comparison and charge merging (addition) to perform analog-to-digital conversion.

As is known in the art, analog-to-digital converters (ADCs) convert a signal in analog format to a signal in digital format. Conventional ADC circuits can have a variety of circuit architectures each of which has certain concomitant benefits and disadvantages. Known ADC architectures include pipeline, sigma-delta, cyclic, flash, successive approximation, and dual-slope. Each architecture is generally applicable to a limited operating range. That is, each of these architectures has strengths and weaknesses that make them more amenable to working in certain frequency and resolution ranges.

Flash ADCs, for example, provide the highest available sampling rates, but at relatively limited resolution and at relatively high power consumption. At the other extreme, sigma-delta ADCs provide very high resolution, but relatively low output sampling rate. The general class of pipeline ADCs is particularly suitable for simultaneous operation at moderate-to-high resolution and moderate-to-high sampling rate. Most pipeline ADCs are implemented using switched-capacitor circuit techniques which employ op-amps. The op-amps limit circuit speed and consume considerable power. Charge-domain (CCD-based) pipeline ADCs eliminate the need for op-amps, and thus provide reduced power consumption and potentially smaller circuit area.

Prior-art charge-domain (CCD-based) pipelined analog-to-digital converters (ADCs) have been limited in precision to approximately 10 bits. A principal reason for this limit is the difficulty of precisely and non-destructively comparing charges in CCD shift registers. Such comparison is performed using floating gates, in which the charges to be compared induce voltage changes on overlying, temporarily floating gates of the CCDs; these voltage changes are then sensed by a voltage comparator circuit. This floating-gate charge-comparison method is subject to errors due to parasitic capacitances, capacitance mismatches, capacitance-precharge or "kTC" noise, and comparator circuit noise and voltage offset. These error causes are all related to the fact that various capacitances, both intrinsic and parasitic to the CCD, limit the available magnitude and accuracy of the differential voltage signal induced by a given differential charge on the floating gates.

Various circuit methods such as comparator auto-zeroing can alleviate these problems, but they generally reduce operating speed, and may increase power dissipation. Similarly, serial comparison, in which the charge packets to be compared are presented in sequence to the same floating gate, can improve charge comparison accuracy, but this method reduces the sample rate of the CCD to half the clock rate, again imposing a reduction of operating speed.

SUMMARY OF THE INVENTION

A pipelined analog-to-digital converter in which signal value samples are represented differentially by pairs of charges and which uses charge-coupled-devices (CCDs) for storage, transport, and arithmetic operations on the charges is presented. In the pipeline, each successive stage resolves an equal or smaller charge difference. After a certain number of pipeline stages, the common-mode component of the signal-charge pair is reduced. The pipeline stages following this common-mode-charge reduction stage have a reduced charge capacity and size, allowing more sensitive charge comparison. The result is improved A/D converter resolution and reduced power consumption.

BRIEF DESCRIPTION OF THE DRAWINGS

The invention will be more fully understood from the following detailed description taken in conjunction with the accompanying drawings, in which.

DETAILED DESCRIPTION OF THE INVENTION

Figure 1:
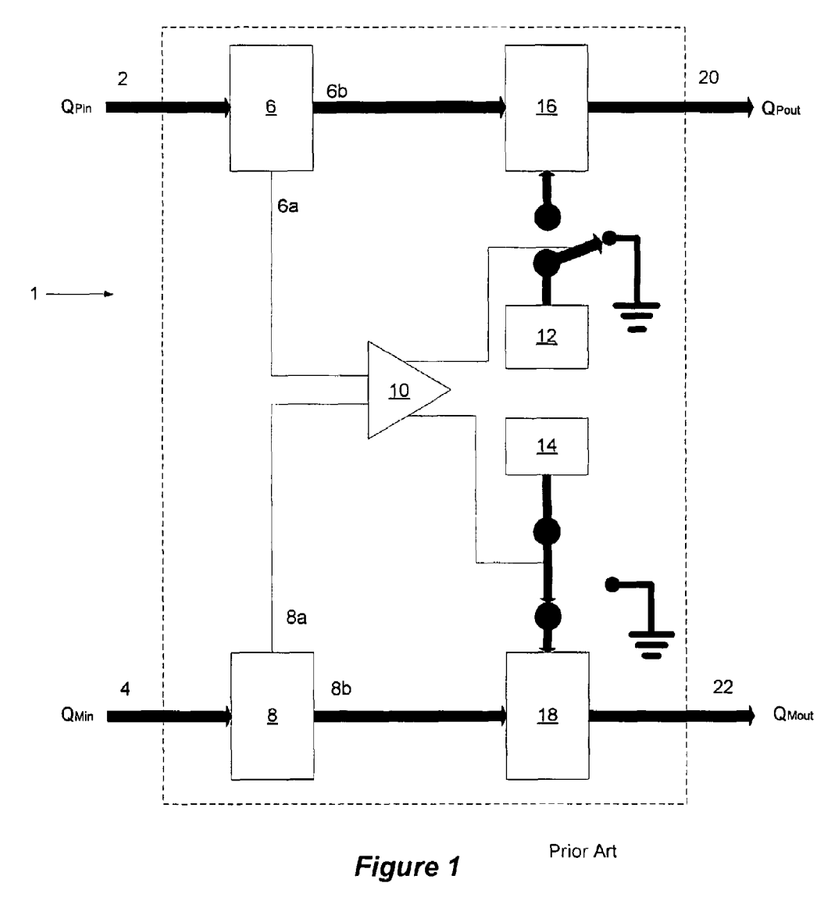
FIG. 1 is a block diagram of a prior art device.

In order to make clear the advantages of the present invention, a brief description of the operation of a prior-art charge-domain pipelined ADC is first described. A typical pipeline stage in such an ADC is shown in FIG. 1. In this schematic representation, charge-transfer paths are shown as heavy lines with arrowheads, and normal (wired) connections are shown as single lines.

The details of the CCD structures are not important to this discussion and are not shown. Likewise the number of storage gates per pipeline stage can be varied from the number shown. The pipeline shown in this example has parallel CCD registers for the two components of the signal-charge pair. ADCs based on similar pipelines in which the signal-charge pair is interleaved in a single CCD register are also within the scope of the present invention.

Referring now to FIG. 1 a pipeline stage 1 operates as follows. A differential signal-charge pair $Q_{Pin}$ 2 and $Q_{Min}$ 4 enter the stage as inputs either from another pipeline stage or from a signal source. Elements 6, 8, 12, 14, 16, and 18 represent storage gates within CCD shift registers, under which charges can be stored. Storage gates 6 and 8 are floating gates. A characteristic of floating gates is that after being pre-charged to a voltage attractive to signal charges, they are disconnected from the voltage source and left electrically floating. When the two signal charges are shifted under floating gates 6 and 8, they induce proportional voltage changes on gates 6 and 8. The resulting voltages 6a and 8a are compared by voltage comparator 10. The decision of the comparator constitutes the digital output $b_{out}$ from this stage (not shown) and indicates which of the two signal charges $Q_{Pin}$ 2 and $Q_{Min}$ 4 is larger. Two nominally equal reference charges are stored under gates 12 and 14. As the input charge pair is shifted to gates 16 and 18 respectively, the comparator decision directs the addition of one of the reference charges to the smaller member of the pair. In this instance the signal charge 8b at gate 8 is smaller than the signal charge 6b at gate 6, thus the reference charge from gate 14 is added to the signal charge 8b from gate 8 at gate 18. The unused reference charge from gate 12 is discarded. If the signal charge 6b at gate 6 were smaller than the signal charge 8b at gate 8, then the reference charge from gate 12 would have been added to the signal charge 6b from gate 6 at gate 16. The unused reference charge from gate 14 would have been discarded. The charge pair resulting from these comparison and addition operations exits gates 16 and 18 as outputs $Q_{Pout}$ 20 and $Q_{Mout}$ 22 respectively.

This process is repeated in successive pipeline stages. The reference charge is ordinarily smaller at each successive stage of the pipeline. The reference charge reduction is typically by a factor of two per stage, yielding binary coding of the digital output from the comparators.

Figure 2:
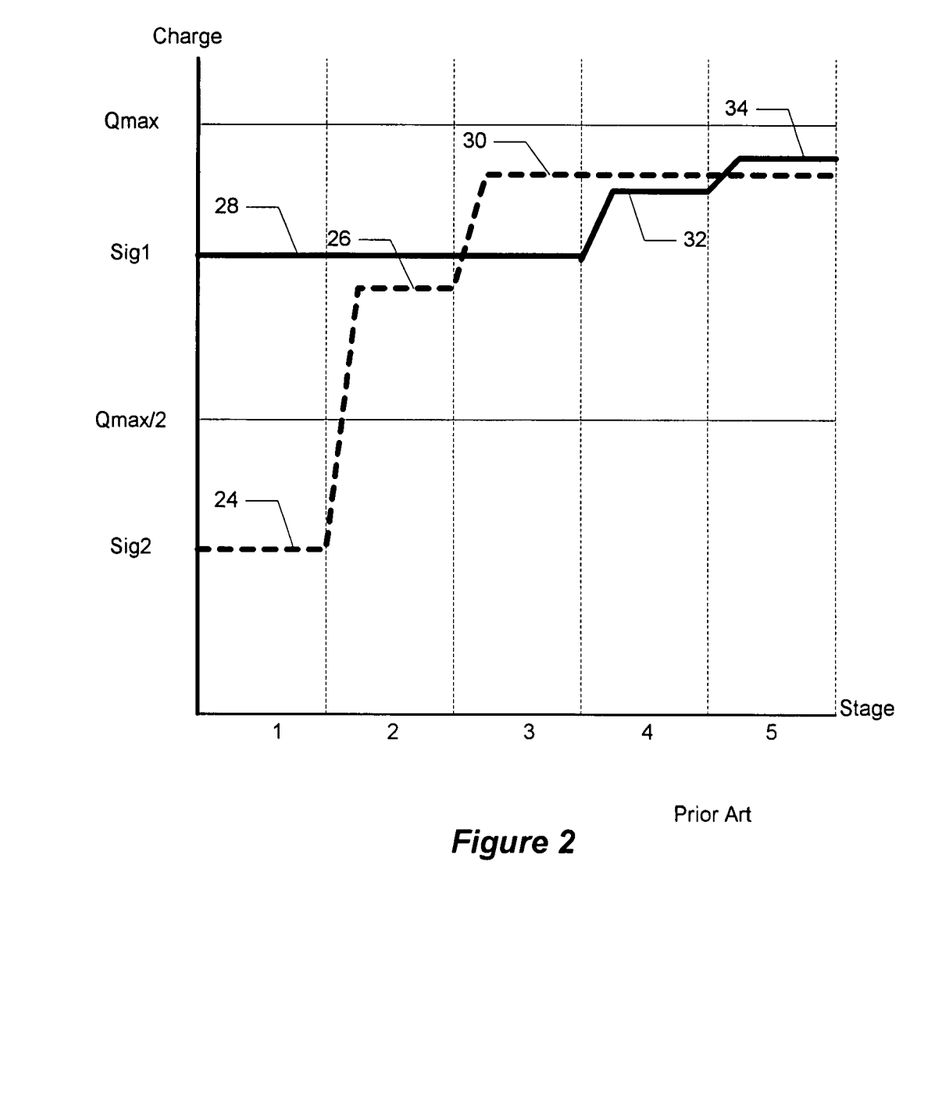
FIG. 2 is a graph of two charge streams of a prior art device.

Referring now to FIG. 2, the sequence of values taken on by a signal-charge pair Sig1 and Sig2 as it progresses through four pipeline stages of the type described in FIG. 1 is shown. As shown in FIG. 2, charges Sig1 and Sig2 are provided as inputs to a first stage. As described above, the charges are compared and a reference charge is added to the smaller of the two charges. At stage 1, Sig2 has a reference charge added to its value 24 to become the value 26, and Sig1 retains its value 28 unchanged. At each stage the reference signal is approximately half the value of the reference signal of the prior stage. At stage 2 the two signals are again compared and a reference charge is added to the smaller of the two signals. In this case, Sig2 again has a reference charge added thereto to produce the charge level 30; again, Sig1 is unchanged. At stage 3, Sig1 is now the smaller of the two signals, so it has a reference charge added thereto to produce a signal having a level 32. This time it is Sig2 which retains its value unchanged at level 30. At stage 4, the two signals are compared and Sig1, again being smaller, has a reference charge added thereto in order to produce the output charge level 34, while Sig2 again is unchanged. As is readily apparent, the two signals converge over a number of stages.

The charge output from a stage is changed in two ways from the charged provided at the input to the stage. First, the smaller of the charges entering the stage is increased by the amount of added reference charge. Over a number of stages, this effect causes the two charges to converge. Second, the common-mode charge, that is, the average of the two signal charges, is increased by half the added reference charge. When $Q_{Pin} > Q_{Min}$, then (as illustrated in FIG. 1):

$$Q_{Pout} = Q_{Pin} \quad \text{(Equation 1)}$$

$$Q_{Mout} = Q_{Min} + Q_{REF} \quad \text{(Equation 2)}$$

and the output common-mode charge is given by $$Q_{CMout} = (Q_{Pout} + Q_{Mout})/2 = (Q_{Pin} + Q_{Min} + Q_{REF})/2 = Q_{CMin} + Q_{REF}/2 \quad \text{(Equation 3)}$$

Both effects are visible in the graph of FIG. 2. The result of these effects is that over several stages, the difference between charges to be compared becomes smaller, while the common-mode charge becomes larger. Both effects degrade charge comparison precision. The increasing common-mode charge exacerbates the effect of floating-gate capacitance mismatch, while requiring relatively large CCD capacitance for its storage. The shrinking charge difference results in smaller induced voltage difference, exacerbating the effects of comparator offset and noise, as well as kTC noise. Because of the necessity of accommodating the common-mode charge, the floating gate capacitance cannot be reduced; otherwise, such reduction could be used to increase the sensitivity of charge comparison.

In the invention herein disclosed, the operation of common-mode charge reduction is applied to alleviate these performance limits, resulting in an increase in ADC resolution.

Figure 3:
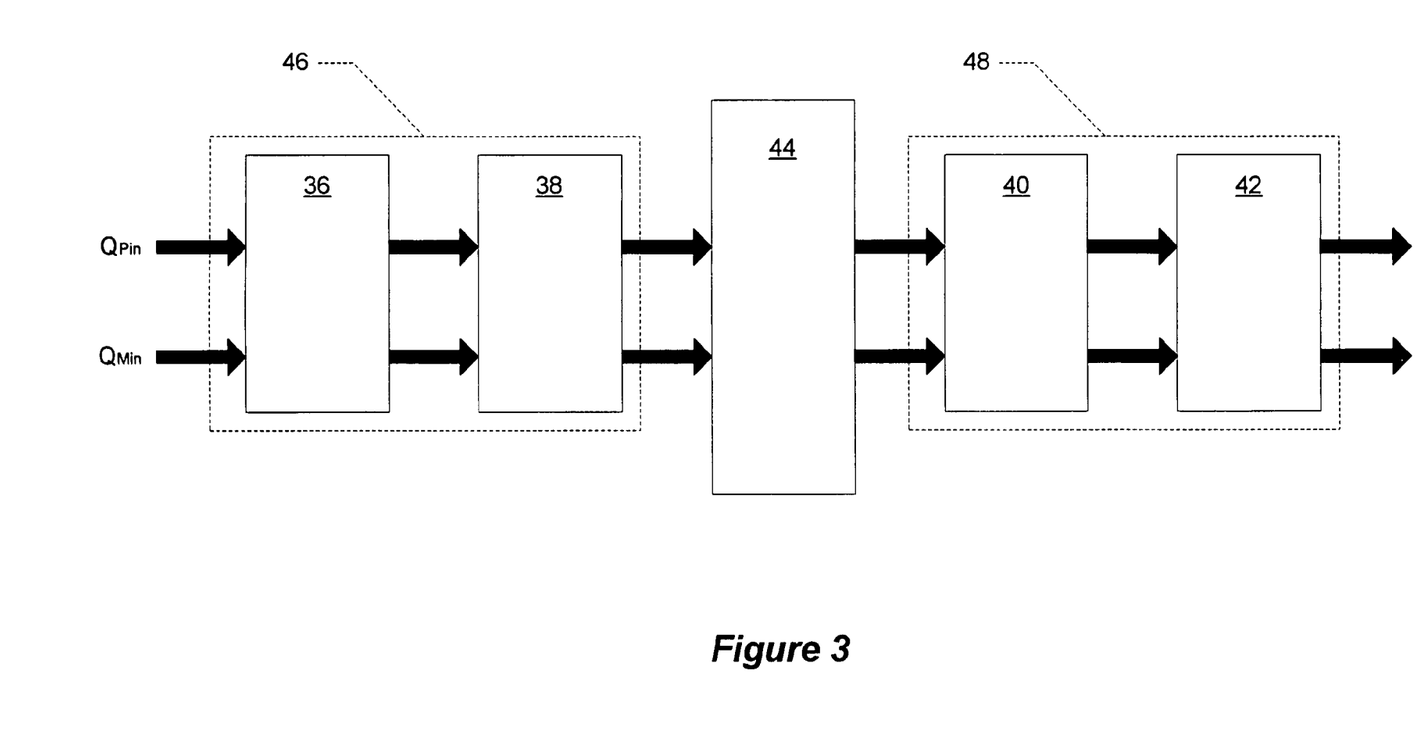
FIG. 3 is a block diagram of the present invention.

Referring now to FIG. 3, a four-stage pipelined charge-domain ADC employing the method of this invention is shown. Each ADC stage 36, 38, 40 and 42 may be similar to the general type shown in FIG. 1. A common-mode (CM) reduction stage 44 is inserted between ADC stages 38 and 40. Additional embodiments of this invention could involve more stages both before and after the CM reduction stage 44. The resulting architecture can be described as a first block 46 of ADC pipeline stages, followed by the CM reduction stage 44, which is in turn followed by a second block 48 of pipelined stages.

Because the differential charge at the output of stage 38 has been reduced relative to the differential input charge to stage 36 (as described above), the differential charge can be supported by a smaller common-mode charge than is needed at the input of stage 36. The CM reduction stage 44 removes a nominally identical charge from each of the charge packets passing through it (i.e., an equal amount from each member of the signal-charge pair, and the same amount from each sequential pair.) Thus the outgoing signal-charge pair, as supplied to the input of stage 40, has a reduced common-mode charge relative to the output of stage 38, while maintaining the same differential charge. Because of this reduced common-mode charge, downstream CCD stages 40 and 42 can be reduced proportionately in size and capacitance. The reductions in floating-gate capacitance $C_{FG}$ and in the common-mode charge alleviate the resolution-limiting effects listed above. Specifically because of smaller $C_{FG}$, the sensitivity of differential floating-gate voltage to differential charge is increased. Additionally, since the common-mode charge is reduced, any $C_{FG}$ mismatch produces a reduced apparent voltage offset. Further, because $C_{FG}$ is reduced, the kTC pre-charge noise is correspondingly reduced. Due to the increased charge-to-voltage conversion sensitivity mentioned above, the effect of voltage noise and offset in the comparator translates to smaller charge errors.

Figure 4:
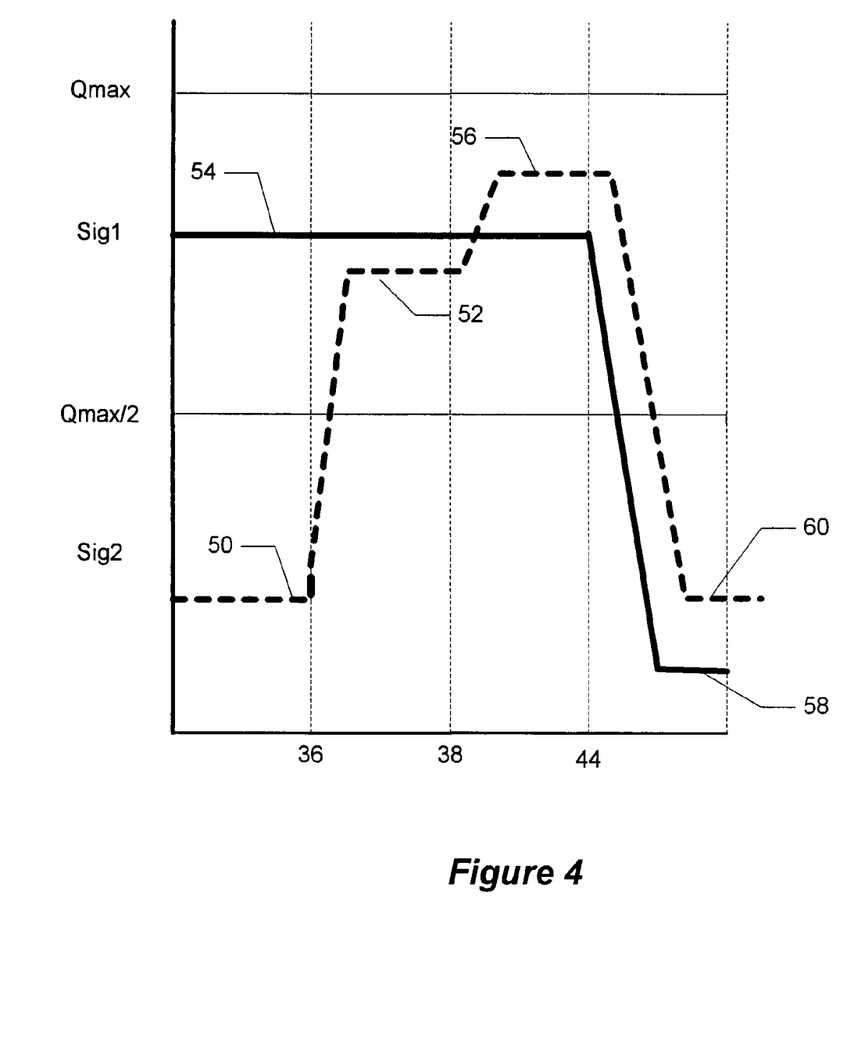
FIG. 4 is a graph of two charge streams of the present invention.

Referring now to FIG. 4, the sequence of values taken on by a signal-charge pair Sig1 and Sig2 as it progresses through the first three stages, 36, 38 and 44, of the circuit of FIG. 3 is shown. As shown in FIG. 4, charges Sig1 and Sig2 are provided to a first stage 36. As described above, the charges are compared and a reference charge is added to the smaller of the two charges. At stage 36, Sig2 has a reference charge added to its value at 50 to become the value at 52, while Sig1 is left unchanged with its value at 54. At each stage the reference charge is approximately half the value of the reference signal of the prior stage. At stage 38 the two charges are compared and a reference charge is added to the smaller. In this case, Sig2 again has a reference charge added thereto to produce the charge level 56; again, Sig1 is unchanged. At the next stage, 44, a common mode reduction operation is performed, resulting in the Sig1 signal being reduced to the value shown at 58. Similarly, Sig2 has been reduced by a same amount resulting in the value at 60. As shown, the difference between the signal levels 58 and 60 at the output of the common mode reduction stage 44 is the same as the difference between the signal levels 56 and 54 at the output of stage 38. At the same time, the common-mode value of the signal pair, equal to the average of levels 58 and 60, is reduced.

The description above shows how the disclosed invention makes more-sensitive charge comparison possible, thus improving ADC resolution. However, in a charge-domain pipeline ADC with two times reference scaling between stages (as is required in order to directly generate a binary output code), a further disadvantage remains. In order for the overall A/D conversion to be accurate to one least-significant bit (LSB), each comparison must be accurate to one LSB. If an early comparison in the pipeline is in error, then the downstream stages cannot correct for the error, even if their comparison resolution is better than that of earlier stages. The disclosed method and apparatus as described so far, however, improves the resolution of stages in the second block 48, but not the resolution of stages in the first block 46.

The resolution of the overall ADC can be improved to the level of the second block 48 by using a technique common in sub-ranging ADCs. The stage-to-stage reference-charge scaling is interrupted at the CM reduction stage, and the following stage (40 in FIG. 3) has a larger reference charge than it would with pure-binary scaling. Typically, the reference charge for stage 40 would be twice its value in a pure binary sequence (i.e., equal to the reference charge in stage 38). This technique enables stages 40 and 42 to correct for errors in previous stages of up to the reference value of stage 38. Thus the first block 46 of the ADC need only have comparisons accurate to the LSB of that block, not the LSB of the whole ADC. The improved resolution of block 48 thus applies to the entire A/D converter. This technique requires, in effect, the addition of one extra stage after the CM reduction stage—that is, stage 40's output bit represents the same magnitude as stage 38's. It also requires added logic to merge the two sub-range results from blocks 46 and 48.

The resulting architecture comprises a combination of the sub-ranging technique with the CM reduction stage. This architecture constitutes a sub-ranging ADC in which each block is itself a pipelined sub-ADC. It is herein described as a "subranging pipelined charge-domain ADC."

In addition to increasing the resolution of the charge-domain ADC, the present invention has the further advantage of reducing its power consumption for a given resolution. This reduction happens in two ways. First, because of relaxed voltage-resolution requirements on the comparators in each block of the multi-stage architecture, their power can be reduced for a given speed. Second, the power required to clock the CCDs comprising the ADC is reduced, for the following reason. For all ADCs in which the signal is represented as charge, signal-to-noise ratio is ultimately limited by the size of the charge packets representing the signal. For any given ADC resolution, a minimum charge-packet size is thus fixed. Clock-power dissipation is proportional to CCD capacitance, which is in turn proportional to the signal charge magnitude. In the sub-ranging architecture described, only the first block has to accommodate the full signal charge. The downstream blocks, having reduced size, thus dissipate less clock power.

A further application of the present invention is to extend the sub-ranging structure by adding a second CM-reduction stage and a third block of pipeline stages, with yet-smaller gate sizes. The result of this extension is a three-stage pipeline of blocks, each block consisting of a multi-stage pipelined (sub-)ADC. This concept could obviously be extended to further stages if such extension were beneficial.

In an alternative pipelined charge-domain ADC implementation, the two charge packets constituting a differential pair are carried sequentially in a single CCD register. In this implementation, charge comparison is done time-sequentially at the same floating gate, thus eliminating the effects of floating-gate capacitance mismatch and comparator DC offset. These characteristics are listed above as limitations of the prior art. A negative consequence of the single-register implementation is that the sample rate is only half that of the parallel-register implementation for a given CCD clock rate. The present invention is equally applicable to this single-register, interleaved-charge ADC implementation. It is useful in this application since by reducing post-CM-reduction channel capacity, it increases floating-gate charge-to-voltage scaling, thus reducing demands on the voltage comparators.

In a further embodiment it is possible to use floating-gate charge replication or other means to amplify the charges entering the common-mode reduction block. The common-mode reduction step is then applied to this amplified signal, or combined with the amplification process, resulting in an amplified differential signal with relatively reduced common-mode charge.

Figure 5:
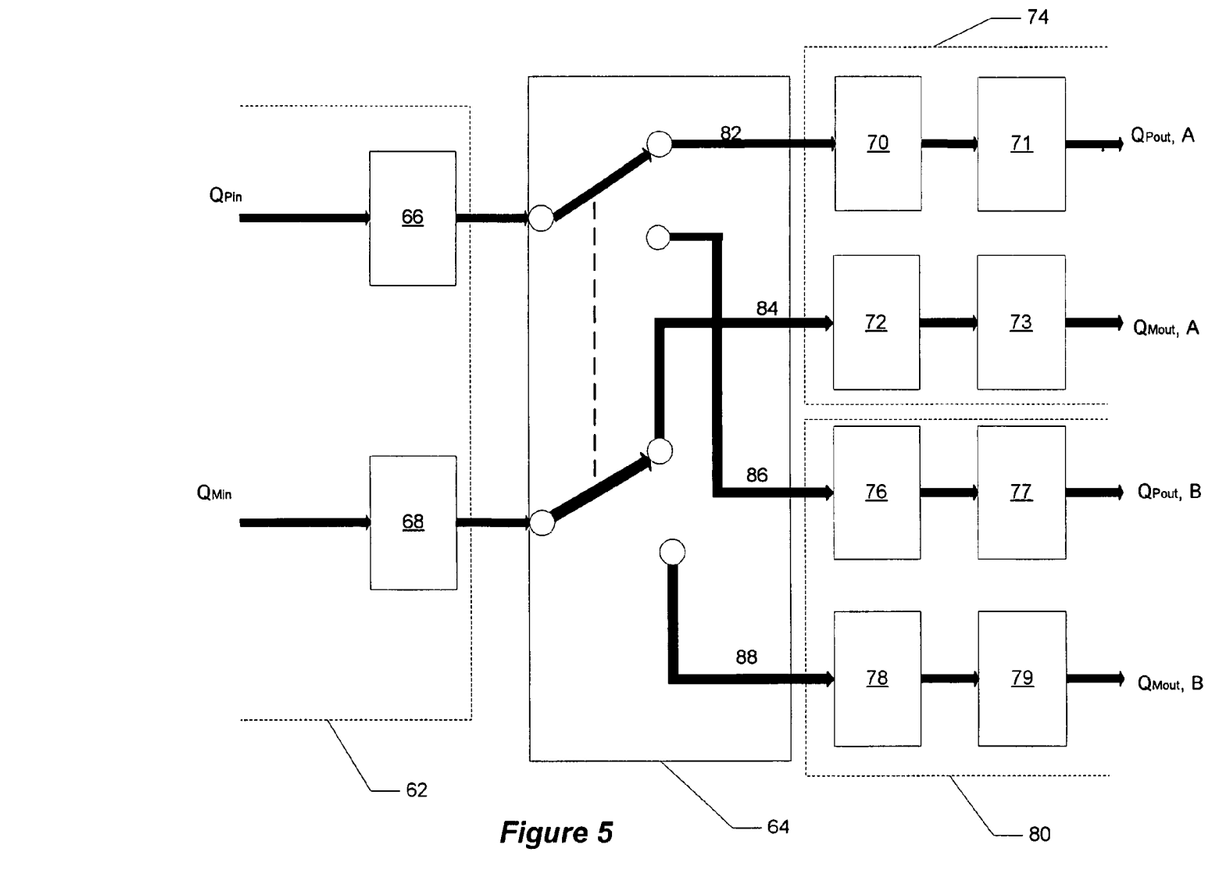
FIG. 5 is a block diagram of a multiplexed embodiment of the present invention.

Referring now to FIG. 5, a further embodiment is shown. In a CM-reduction stage 64 the signal charges are temporarily transported on metallic connections rather than by CCD transfer. During such a metallic transfer, the charges can be topologically re-arranged and/or switched to alternate paths. Thus it is feasible for the CM-reduction-stage output charges to be demultiplexed into two or more outgoing CCD registers.

Elements 66 and 68 in FIG. 5 represent the final storage gates of 62, the pipeline stage immediately preceding the common-mode reduction stage 64. 70 and 72 represent the first storage gates of 74, a first pipeline stage following the common-mode reduction stage 64. Elements 76 and 78 represent the first storage gates of 80, a second pipeline stage following the common-mode reduction stage 64. Storage gates 71 and 73 store the outputs from gates 70 and 72 respectively. Storage gates 77 and 79 store the outputs from gates 76 and 78 respectively. Each of the pipeline stages 74 and 80 is equivalent to stage 40 in FIG. 3. The added feature in this embodiment is that the common-mode reduction stage 64 directs the outgoing charge-packet pairs alternately between the two sets of output 82, 84 and 86, 88 of the stage 64. These outputs are provided respectively to the two following pipelines, of which the input stages are respectively 74 and 80. Stage 64 combines the de-multiplexing function indicated explicitly in FIG. 5 with the common-mode reduction functionality previously discussed. This figure shows two outgoing pipelines for simplicity; however the number can be greater than two.

If this method is used with N output pipelines, then each of these N pipelines can be operated at 1/N the clock rate of the pipeline stages preceding common-mode reduction stage 64. This lower clock rate can be exploited directly to make the charge comparison more sensitive. For example, the speed and thus the noise bandwidth of the comparators can be reduced, and more precise auto-zeroing of the comparators can be employed.

Figure 6:
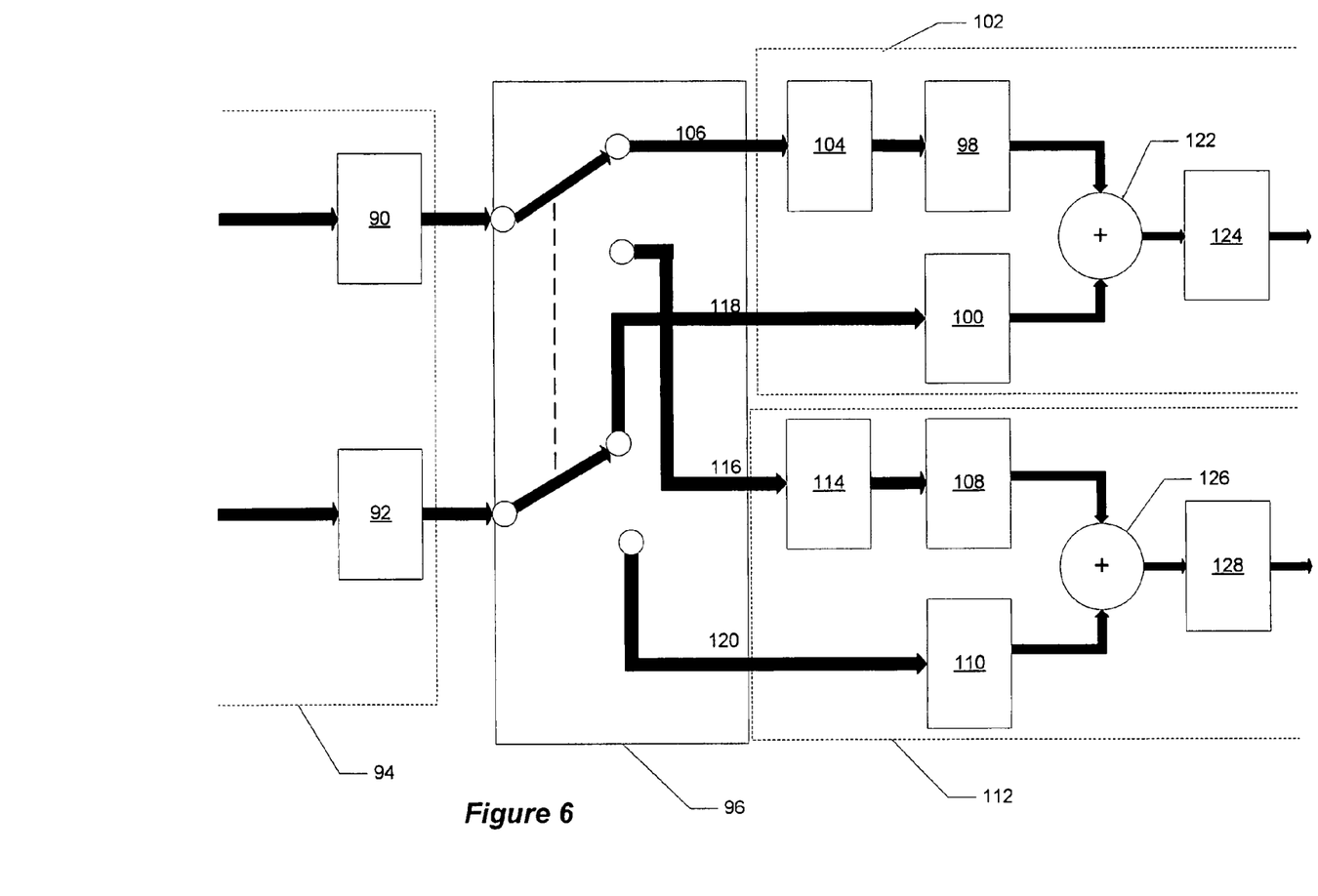
FIG. 6 is a block diagram of a further embodiment of a multiplexed device.

Alternatively, output signal-charge pairs from stage 64 can be injected sequentially into the same CCD channel, rather than simultaneously into a pair of channels, allowing sequential charge comparison as discussed above. This concept is shown in FIG. 6 (which again illustrates the case of only two outgoing pipelines, although more are possible). Since this alternative has multiple single-register pipelines following the CM-reduction stage, the sample rate of the overall ADC is not reduced as it would be in the case of an entire ADC based on a single register.

Elements 90 and 92 in FIG. 6 represent the final storage gates of 94, the pipeline stage immediately preceding the common-mode reduction stage 96. Gates 98 and 100 represent the first storage gates of 102, a first pipeline stage following the common-mode reduction stage 96. A delay gate 104 is disposed between the output 106 of the common-mode reduction stage 96, and storage gate 98. Elements 108 and 110 represent the first storage gates of 112, a second pipeline stage following the common-mode reduction stage 96. A delay gate 114 is disposed between the output 116 of the common-mode reduction stage 96, and storage gate 108. Each of the pipeline stages 102 and 112 is equivalent to stage 40 in FIG. 3. The common-mode reduction stage 96 directs its outgoing charge-packet pairs alternately between the two sets of outputs 106, 118 and 116, 120. The outputs of storage gates 98 and 100 are merged by element 122 then stored in storage gate 124. The resulting signal in 124 comprises sequential charge pairs, allowing sequential charge comparison, as described above. Similarly, the outputs of storage gates 108 and 110 are merged by element 126 then stored in storage gate 128. The resulting signal in 218 comprises sequential charge pairs, allowing sequential charge comparison, as described above. This figure shows two outgoing pipelines for simplicity; however the number can be greater than two.

In the present invention the reduction of common-mode charge of the signal-charge pairs relative to the differential charge signal as they propagate between blocks of the ADC pipeline is disclosed. This common-mode charge reduction can be accomplished passively, by removing a fixed charge from each charge packet. Other methods could be employed to implement the present invention, including the following. Active circuitry could be used to improve the linearity and/or speed of the common-mode-reduction operation. A dynamic-double-sampling wire-transfer technique is one example; and the use of op-amp integrators is another. Differential charge-packet-splitting could be used to generate the downstream charge pairs. Such a splitter could be driven by floating-gate or floating-diffusion sensors of the signal-charge packets, with or without active gain or buffering circuitry. The common-mode-to-differential-mode ratio of the outgoing charge pair can be chosen to be reduced relative to that of the incoming charge pair in each of these methods.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. A pipelined charge-domain (CCD-based) analog-to-digital converter comprising:
    a first block of pipeline stages having an input adapted to receive a signal to be converted, said first block having an output; and
    a first common-mode reduction circuit having an input coupled to the output of the first block, and having an output.

2. The converter of claim 1 wherein said signal to be converted comprises a differential charge pair.

3. The converter of claim 2 wherein said common-mode reduction circuit comprises circuitry for subtracting a substantially equal amount of charge from said charge pair, thus reducing the common-mode charge of the charge pair while maintaining substantially unaltered the difference in charge between the charge pair.

4. The converter of claim 2 wherein said common-mode reduction circuit comprises circuitry for amplifying the difference in charge between said charge pair while reducing the common-mode charge of the pair relative to the charge difference.

5. The converter of claim 2 wherein the two elements of said charge pair are presented simultaneously.

6. The converter of claim 5 wherein said first block comprises at least one ADC pipeline stage, each of said at least one ADC pipeline stage comprising:
    a first charge-coupled device (CCD) channel adapted to receive a first charge signal of said differential charge pair;
    a second CCD channel adapted to receive a second charge signal of said differential charge pair;
    a first charge adjustment circuit coupled to said first CCD channel and responsive to a digital control signal; and
    a second charge adjustment circuit coupled to said second CCD channel and responsive to said digital control signal.

7. The converter of claim 6 wherein each of said at least one ADC pipeline stage further comprises at least one comparator coupled to said first CCD channel and to said second CCD channel and generating said digital control signal.

8. The converter of claim 2 wherein the two elements of said charge pair are presented sequentially in time.

9. The converter of claim 8 wherein said first block comprises at least one ADC pipeline stage, each of said at least one ADC pipeline stage comprising:
    a charge-coupled device (CCD) channel adapted to sequentially receive a first charge signal of said differential charge pair and a second charge signal of said differential charge pair; and
    a charge adjustment circuit coupled to said CCD channel and responsive to a digital control signal.

10. The converter of claim 9 wherein each of said at least one ADC pipeline stage further comprises at least one comparator coupled to said CCD channel and generating said digital control signal.

11. The converter of claim 1 further comprising a second block of pipeline stages having an input coupled to the output of said common-mode reduction circuit.

12. The converter of claim 11 wherein said input of said second block of pipeline stages comprises a differential charge pair.

13. The converter of claim 12 wherein the two elements of said charge pair are presented simultaneously.

14. The converter of claim 13 wherein said second block comprises at least one ADC pipeline stage, each of said at least one ADC pipeline stage comprising:
a first charge-coupled device (CCD) channel adapted to receive a first charge signal of said differential charge pair;
a second CCD channel adapted to receive a second charge signal of said differential charge pair;
a first charge adjustment circuit coupled to said first CCD channel and responsive to a digital control signal; and
a second charge adjustment circuit coupled to said second CCD channel and responsive to said digital control signal.

15. The converter of claim 14 wherein each of said at least one ADC pipeline stage further comprises at least one comparator coupled to said first CCD channel and to said second CCD channel and generating said digital control signal.

16. The converter of claim 13 wherein said second block of pipeline stages converts said charge pair from simultaneous to sequential representation before further processing.

17. The converter of claim 12 wherein the two elements of said charge pair are presented sequentially in time.

18. The converter of claim 17 wherein said second block comprises at least one ADC pipeline stage, each of said at least one ADC pipeline stage comprising:
a charge-coupled device (CCD) channel adapted to sequentially receive a first charge signal of said differential charge pair and a second charge signal of said differential charge pair; and
a charge adjustment circuit coupled to said CCD channel and responsive to a digital control signal.

19. The converter of claim 18 wherein each of said at least one ADC pipeline stage further comprises a comparator coupled to said CCD channel and generating said digital control signal.

20. The converter of claim 11 further comprising a second common-mode reduction circuit having an input coupled to the output of said second block of pipeline stages, and having an output.

21. The converter of claim 20 further comprising a third block of pipeline stages having an input coupled to said output of said second common-mode reduction circuit.

22. The converter of claim 1 wherein said common-mode reduction circuit provides a plurality of outputs.

23. The converter of claim 22 further comprising a plurality of blocks of pipeline stages, each of said blocks having an input coupled to an output of said common-mode reduction circuit.

24. The converter of claim 22 in which said plurality of outputs are provided sequentially in time.

25. A method of processing a signal represented as a differential pair of charge packets in at least one CCD register comprising:
(a) receiving a signal to be processed
(b) adding charge to one of said packets based on a digital control signal; and
(c) reducing the relative common-mode charge of the resulting signal, to provide an output signal.

26. The method of claim 25 wherein steps (a) and (b) are repeated at least once.

27. The method of claim 26 wherein said charge packets are provided simultaneously to two CCD registers.

28. The method of claim 26 wherein said charge packets are provided sequentially to a single CCD register.

29. The method of claim 25 wherein said reducing comprises subtracting a substantially equal amount of charge from each charge packet of said resulting signal, while maintaining substantially the same difference in charge between the charge packets of said resulting signal.

30. The method of claim 21 wherein said reducing comprises amplifying the charge difference of said resulting signal while reducing the common-mode charge of said signal relative to the charge difference.

31. The method of claim 25 further comprising:
(d) comparing said charge packets prior to step b and generating said digital control signal based on a result of said comparison.

32. The method of claim 31 wherein said steps (a), (d), and (b) are repeated at least once.

33. The method of claim 25 wherein said reducing further comprises providing a plurality of output signals.

34. The method of claim 33 wherein each of said plurality of output signals is further processed by receiving said plurality of output signals and adding charge to one packet of each of said output signals.

35. The method of claim 25 further comprising:
receiving said output signal; and
adding charge to one of said packets of said output signal based on a digital control signal to provide a second output signal.

36. The method of claim 35 further comprising reducing the relative common-mode charge of the second output signal.

* * * * *

UNITED STATES PATENT AND TRADEMARK OFFICE
CERTIFICATE OF CORRECTION

| | | |
|---|---|---|
| PATENT NO. | : 6,972,707 B1 | Page 1 of 1 |
| APPLICATION NO. | : 10/889282 | |
| DATED | : December 6, 2005 | |
| INVENTOR(S) | : Anthony | |

It is certified that error appears in the above-identified patent and that said Letters Patent is hereby corrected as shown below:

Column 3, line 3 delete "Referring now to FIG. 1 a" and replace with --Referring now to Fig. 1, a--.

Column 3, line 63 delete "charged" and replace with --charge--.

Column 5, line 59 delete "Subranging" and replace with --Sub-ranging--.

Column 6, line 33 delete "further embodiment it" and replace with --further embodiment, it--.

Column 7, lines 65-66 delete "of the invention it will" and replace with --of the invention, it will--.

Column 8, line 1 delete "Submitted that that the" and replace with --Submitted that the--.

Column 10, line 6 delete "to be processed" and replace with --to be processed;--.

Column 10, line 31 delete "step b" and replace with --step (b)--.

Signed and Sealed this

Fifteenth Day of April, 2008

JON W. DUDAS
*Director of the United States Patent and Trademark Office*